United States Patent
Kim et al.

(10) Patent No.: US 7,518,850 B2
(45) Date of Patent: *Apr. 14, 2009

(54) HIGH YIELD, HIGH DENSITY ON-CHIP CAPACITOR DESIGN

(75) Inventors: Jonghae Kim, Fishkill, NY (US); Moon J. Kim, Wappingers Falls, NY (US); Jean-Olivier Plouchart, New York, NY (US); Robert E. Trzcinski, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 339 days.

This patent is subject to a terminal disclaimer.

(21) Appl. No.: 11/436,248

(22) Filed: May 18, 2006

(65) Prior Publication Data

US 2007/0268653 A1    Nov. 22, 2007

(51) Int. Cl.
  *H01G 4/38* (2006.01)
  *H01G 4/00* (2006.01)
  *H01L 27/108* (2006.01)
  *H01L 29/94* (2006.01)
  *H01L 21/20* (2006.01)

(52) U.S. Cl. .................. 361/328; 257/303; 257/307; 257/595; 361/329; 361/301.2; 438/396

(58) Field of Classification Search ............ 361/328, 361/301.2, 239; 257/306, 307, 308; 438/396
See application file for complete search history.

(56) References Cited

U.S. PATENT DOCUMENTS 6,212,060 B1   4/2001   Liu et al. .................... 361/329

(Continued)

FOREIGN PATENT DOCUMENTS

WO     WO 0057454 A2    9/2000

OTHER PUBLICATIONS

Jonghae Kim et al, "3-dimensional Vertical Parallel Plate Capacitors in an SOI CMOS Technology for Integrated RF Circuits", 2003 Symposium on VLSI Circuits, Digest of Technical Papers, Kyoto, Japan, Jun. 12-14, 2003, Symposium on VLSI Circuits, New York, NY, IEEE, USA, Jun. 12, 2003, pp. 29-32, XP010651118.

(Continued)

*Primary Examiner*—Eric Thomas
*Assistant Examiner*—David M Sinclair
(74) *Attorney, Agent, or Firm*—Patrick J. Daugherty; Driggs, Hoff, Daugherty & Del Zoppo Co., LPA

(57) ABSTRACT

A capacitance circuit assembly mounted on a semiconductor chip, and methods for forming the same, are provided. A plurality of divergent capacitors is provided in a parallel circuit connection between first and second ports, the plurality providing at least one Metal Oxide Silicon Capacitor and at least one Vertical Native Capacitor or Metal-Insulator-Metal Capacitor. An assembly has a vertical orientation, a Metal Oxide Silicon capacitor located at the bottom and defining a footprint, with a middle Vertical Native Capacitor having a plurality of horizontal metal layers, including a plurality of parallel positive plates alternating with a plurality of parallel negative plates. In another aspect, vertically asymmetric orientations provide a reduced total parasitic capacitance.

5 Claims, 8 Drawing Sheets

U.S. PATENT DOCUMENTS

| | | | |
|---|---|---|---|
| 6,278,871 | B1 | 8/2001 | Jovenin et al. |
| 6,891,219 | B2 | 5/2005 | Allman et al. ............... 257/311 |
| 2005/0184357 | A1 | 8/2005 | Chiba |
| 2006/0024905 | A1* | 2/2006 | He et al. ..................... 438/396 |
| 2006/0180895 | A1* | 8/2006 | Chen et al. .................. 257/595 |
| 2007/0102745 | A1* | 5/2007 | Hsu et al. .................... 257/303 |

OTHER PUBLICATIONS

Jonghae Kim et al, "Design and Manufacturability Aspect of SOI CMOS RFICs" Custom Integrated Circuits Conference, 2004, Proceedings of the IEEE 2004 Orlando, FL, USA Oct. 3-6, 2004, Piscataway, NJ, USA, IEEE, Oct. 3, 2004 pp. 541-548, XP01074237.

Xudong Wang et al, "Meeting the Design Challenges in Modern RFCMOS Technology", Solid-State and Integrated Circuits Technology, 2004, Proceedings, 7th International Conferenece on Beijing, China, Oct. 18-21, 2004, Piscataway, NJ, USA IEEE, US, Oct. 18, 2004, pp. 1291-1294, XP010806521.

Pekarik, J. et al, "RFCMOS Technology from 0.25/spl mu/m to 65nm: the State of the Art", Custom Integrated Circuits Conference, 2004, Proceedings of the IEEE 2004 Orlando, FL, USA, Oct. 3-6, 2004, Piscataway, NJ, USA, IEEE, Oct. 3, 2004, pp. 217-224, XP010742276.

* cited by examiner

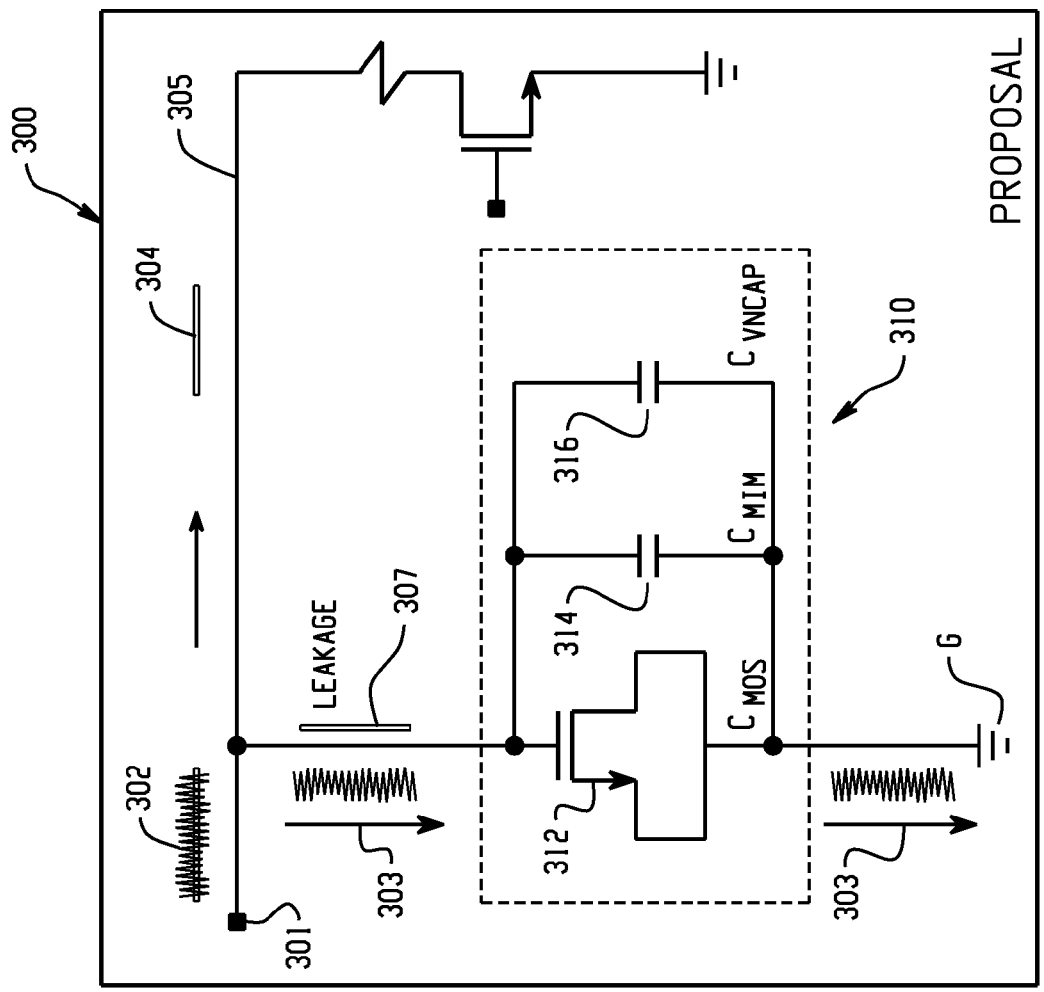
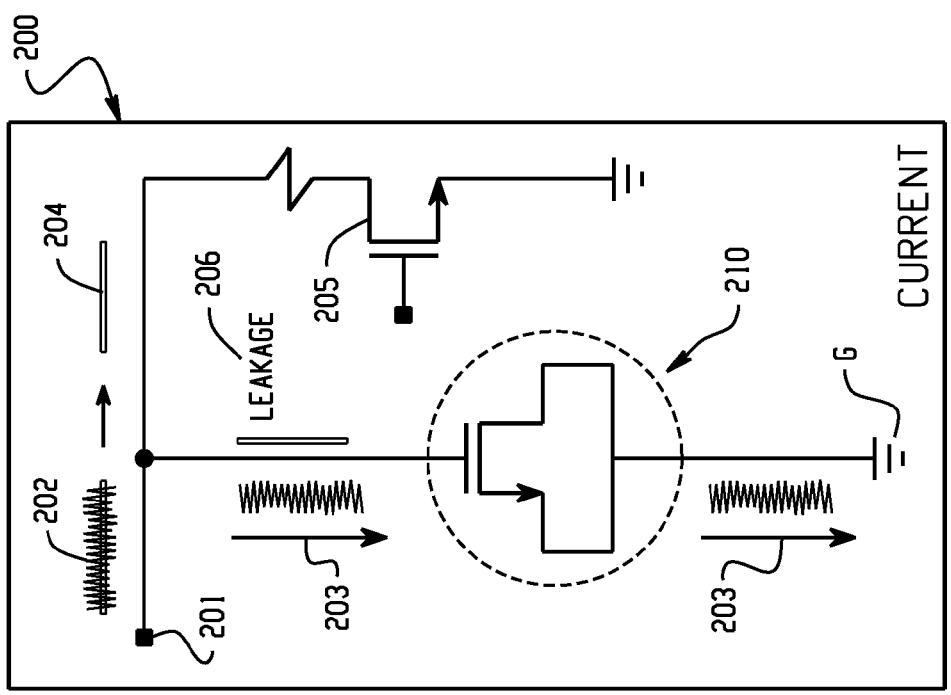
Fig. 3
Fig. 2 PRIOR ART

MIM CAPACITOR

MOS CAPACITOR

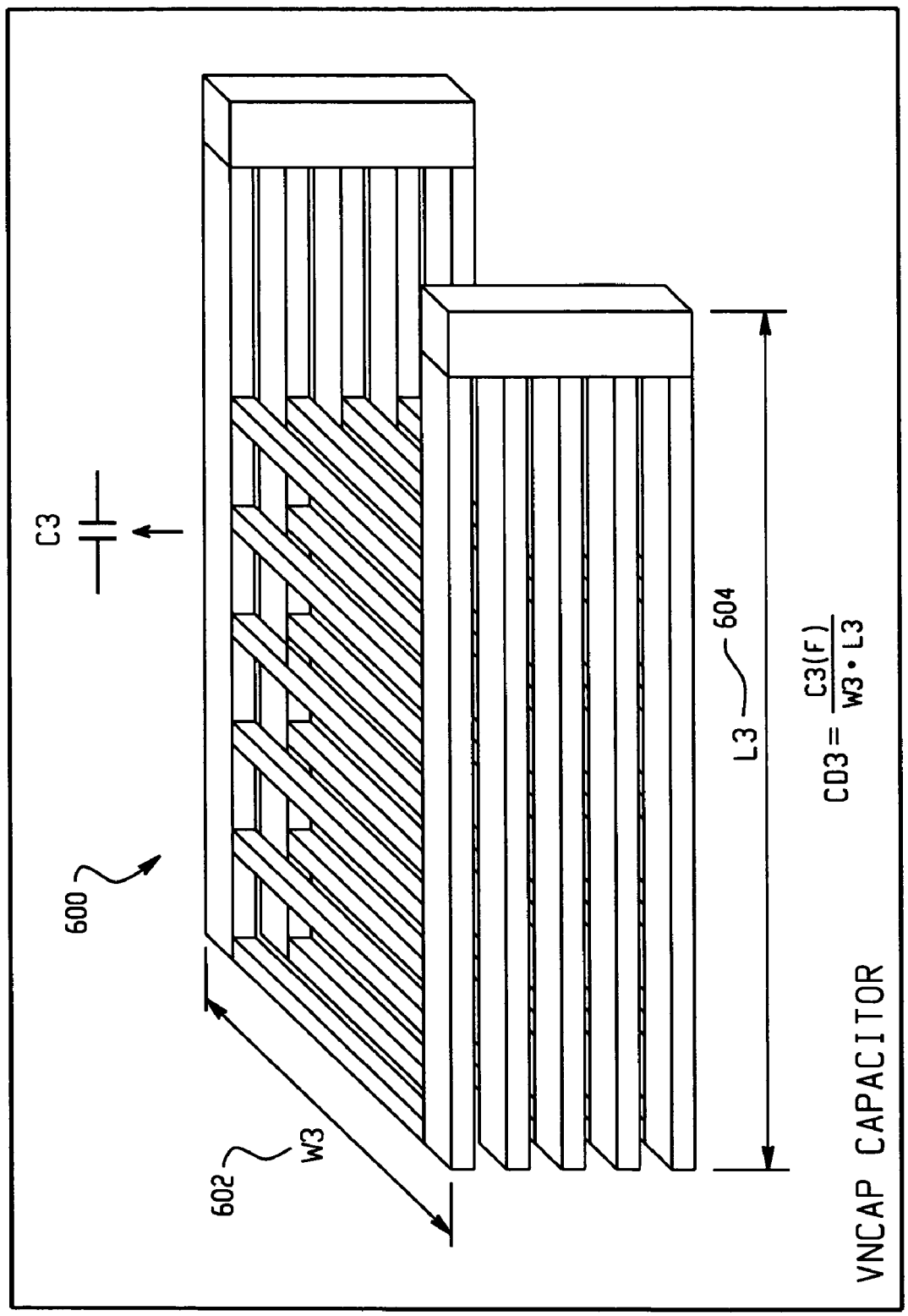

HIGH YIELD, HIGH DENSITY ON-CHIP CAPACITOR DESIGN

FIELD OF THE INVENTION

This invention relates to capacitors on semiconductor chips. More particularly, the invention relates to silicon semiconductor chip capacitor structures comprising multiple parallel divergent capacitors.

BACKGROUND OF THE INVENTION

To enhance the understanding of the discussion that follows, the abbreviations and terms listed below will have the definitions as shown, the meaning and significance of which will be readily apparent to one skilled in the art of circuit board capacitor structures:
- ADC—Analog to digital converter;
- BEOL—Back end of line;
- CA—Tungsten contact between metal and polysilicon;
- Csub—Adjustable capacitor;
- DAC—Digital to analog converter;
- FEOL—Front end of line;
- MIMCAP—Metal-insulator-metal capacitor;
- MOS—Metal oxide silicon;
- RF—Radio frequency;
- VNCAP—Vertical native capacitor.

On-chip capacitors are critical components of integrated circuits that are fabricated on silicon semiconductors. These capacitors are used for a variety of purposes including bypass and capacitive matching as well as coupling and decoupling. For example, FIG. 1 illustrates three different silicon semiconductor chip functional capacitor structures: (a) a by-pass capacitor structure BPC; (b) an AC-coupling capacitor structure ACCC; and (c) a reactive capacitor structure RC for high frequency matching. More particularly, in the by-pass capacitor structure BPC in FIG. 1(a), a capacitor 100 is configured to bypass AC noise signals 103 from a power supply 101. As is well known, a power supply signal 102 from a power supply 101 may include AC noise signals 103, including noise signals 103 from other neighboring circuits (not shown). It is preferable to remove the AC noise signals 103 from the power supply signal 101 prior to supply of power to the circuit structure 105. Accordingly, the bypass capacitor 100 is provided to flow the AC noise signals 103 into ground G and provide a clean DC power signal 104 to the circuit 105.

FIG. 1(b) illustrates an AC-coupling capacitor structure ACCC to de-couple a DC signal 107 and couple an AC signal 109 into a circuit input port 110. By locating a DC de-coupling/AC coupling capacitor 106 in series between two ports 108 and 110, the capacitor 106 blocks DC signal 107 flow, thereby allowing only an AC signal 109 to pass into the circuit 110. And FIG. 1(c) illustrates a reactive capacitor structure RC, wherein a capacitor 111 provides a high frequency capacitive component for a circuit input 113, the signal coupling at a high frequency region based on characteristic impedance matching to reduce reflected power between ports 114 and 115.

The design and implementation of by-pass capacitor, AC-coupling capacitor and reactive capacitor structures on silicon semiconductor chips may be dependent upon one or more symmetrical structural, target circuit quality and low parasitic resistance performance characteristics. In particular, a bypass capacitor structure is typically required to provide a highest capacitance possible relative to the physical structure of the circuit and device. However, the reactance resistance of the bypass capacitor is generally required to be as low as possible for a target AC noise signal frequency. More particularly, reactance resistance R_cap(f) may be computed through the following Equation 1:

$$R\_cap(f) = 1/(2*pi*f*C);\qquad \text{Equation 1}$$

wherein pi is a constant, the ratio of a circle's circumference to its diameter (i.e. about 3.14); f is the frequency of the AC flowing through the circuit; and C is a capacitance value of the capacitor element in the circuit, for example capacitor 100 in FIG. 1(a).

It is known to use a metal oxide silicon (MOS) capacitor, or MOSCAP, for the capacitor element 100. However, MOSCAP capacitors require large chip area footprints in integrated circuits (IC). Accordingly, prior art design requirements typically result in requiring large semiconductor chip footprint areas or real estate for a bypass capacitor structure, resulting in high production costs and reduced semiconductor chip area availability for other circuit structures. As the production cost of an IC is generally proportional to the real estate required, it is desired to reduce IC chip costs by reducing the footprint required for a MOSCAP structure.

Moreover, current leakage during a semiconductor circuit's idle mode is known to result in increased power consumption. Silicon semiconductor chip capacitor structures usually require large MOSCAP capacitor structures in order to avoid current leakage problems.

What is needed is a method and structure for providing high density, high yield on-chip capacitor structures for integrated circuits and, more particularly, for silicon-based semiconductor chips.

SUMMARY OF THE INVENTION

Aspects of the present invention address these matters, and others.

A capacitance circuit assembly mounted on a semiconductor chip, and method for forming the same, are provided comprising a plurality of divergent capacitors in a parallel circuit connection between first and second ports, the plurality comprising at least one Metal Oxide Silicon Capacitor and at least one capacitor selected from the group comprising a Vertical Native Capacitor and a Metal-Insulator-Metal Capacitor.

In one aspect, the plurality of parallel divergent capacitors has a vertical structure orientation with respect to the semiconductor chip, a Metal Oxide Silicon capacitor located at a bottom of the vertical structure and defining a capacitance circuit assembly footprint area on the semiconductor chip. A metal-oxide-silicon capacitor is formed at a bottom of a front end-of-line of a semiconductor chip by disposing a plurality of source, gate and drain regions within overall horizontal length, the gate regions each having a common horizontal length, the common lengths defining an effective horizontal width dimension, the effective horizontal width and the overall horizontal length defining a horizontal footprint on the semiconductor chip. A vertical-native capacitor is formed with horizontal metal layers in a back end-of-line of the semiconductor chip and vertically above the metal-oxide-silicon capacitor and within the footprint, each of the layers comprising parallel positive plates alternating with parallel negative plates. A metal-insulator-metal capacitor is formed in the back end-of-line of the semiconductor chip and vertically above the metal-oxide-silicon capacitor and the vertical-native capacitor and within the footprint, with a top negative plate horizontally spaced over a parallel bottom positive plate.

In the methods, the vertical-native capacitor parallel positive plates, the metal-insulator-metal capacitor bottom positive plate, and the metal-oxide-silicon capacitor drains and sources are electrically connected to a first port; and the vertical-native capacitor parallel negative plates, the metal-insulator-metal capacitor top negative plate and the metal-oxide-silicon capacitor gates are electrically connected with a second port. The metal-insulator-metal capacitor, the vertical-native capacitor and the metal-oxide-silicon capacitor thus define a composite capacitance density value between the first port and the second port about twice a capacitance density value of the metal-oxide-silicon capacitor.

BRIEF DESCRIPTION OF THE DRAWINGS

The various drawings are intended to assist in a complete understanding of the features of the invention, and are not presented as a limitation on the scope thereof.

FIG. 2 is an electrical schematic illustration of a prior art by-pass capacitor structure.

FIG. 3 is an electrical schematic illustration of a by-pass capacitor structure according to the present invention.

FIG. 6 is a perspective view of a VNCAP capacitor according to the present invention.

DETAILED DESCRIPTION OF THE INVENTION

Figure 1C:
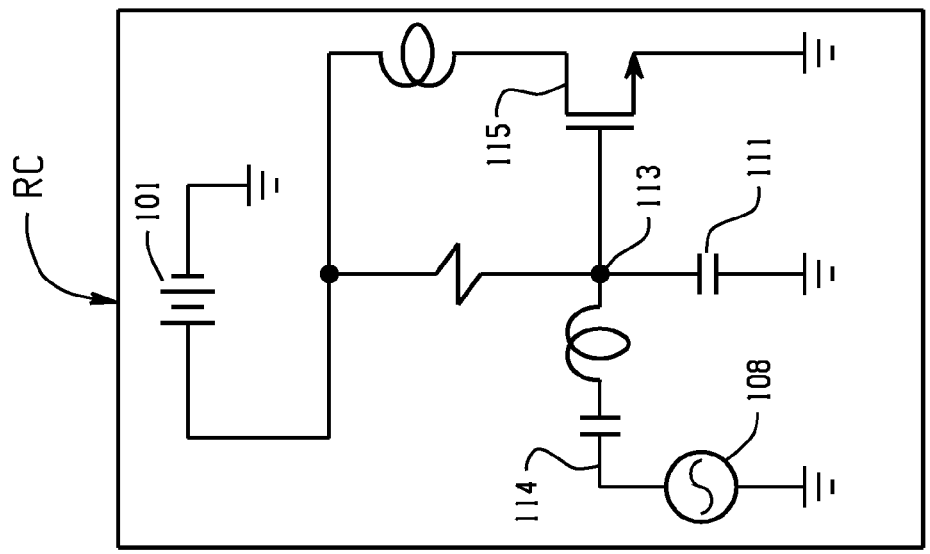
FIG. 1 is an electrical schematic illustration of different prior art silicon semiconductor chip capacitor structures.
Figure 1B:
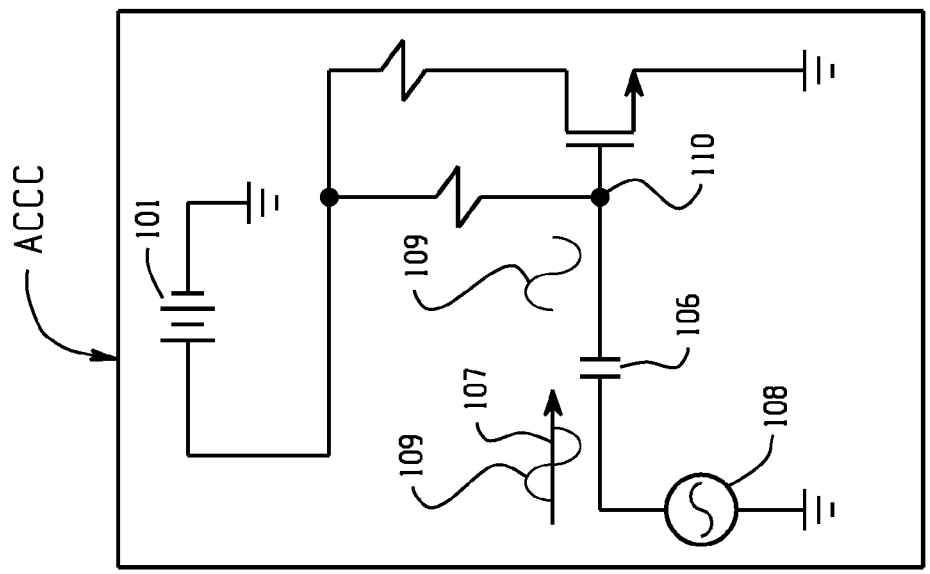
Figure 1A:
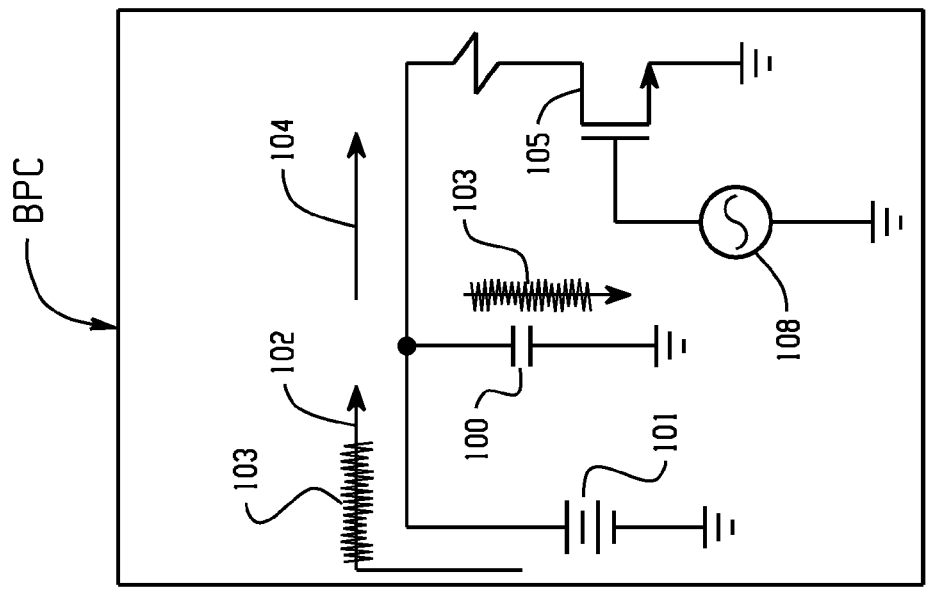

FIG. 2 illustrates a prior art by-pass capacitor structure 200, wherein a MOSCAP 210 is configured to bypass AC noise signals 203 from a noisy power signal 202 from a power supply 201 prior to supply of power to a circuit structure 205. The bypass MOSCAP 210 flows AC noise signals 203 into ground G, thus providing a clean DC power signal 204 to the circuit 205. Some of the noisy power signal 202 current is also lost as leakage 206 by the MOSCAP 210.

FIG. 3 illustrates a by-pass capacitor structure 300 according to the present invention with a multicapacitor circuit element 310, the multicapacitor element 310 comprising three capacitors 312, 314 and 316 arranged in parallel between a noisy power signal 302 and ground G. The multicapacitor element 310 bypasses AC noise signals 303 from the noisy power signal 302 from the power supply 301 into ground G prior to supply of power to a circuit structure 305, thus providing a clean DC power signal 304 to the circuit 305. Some of the noisy power signal 302 current is also lost as leakage 307 by the multicapacitor element 310.

In one aspect, the multicapacitor element 310 requires less semiconductor chip real estate than a prior art single capacitor element 210, thereby proportionally reducing chip production costs. In another aspect, the multicapacitor element 310 provides for a reduction in the amount of current 307 lost to leakage relative to a prior art single capacitor element 210 current leakage 206, thereby increasing performance yield relative to component size as compared to the prior art single capacitor element 210.

In one example, the multicapacitor element 310 comprises a MOSCAP, or CMOS, 312 in parallel with a metal-insulator-metal capacitor (CMIM) 314, and a vertical native capacitor (CVNCAP) 316. These elements will provide design advantages as described presently, but it will be apparent that other capacitor structures may be practiced with the present invention. In one aspect, a parallel CMOS 312/CMIM 314/CVN-CAP 316 element 310 may achieve bypass capacitor functions with a CMOS 312 chip footprint of about, or less than, one-half that of a prior art single CMOS element 210. And, furthermore, where the parallel CMOS 312/CMIM 314/CVNCAP 316 element 310 is configured in a vertical structure having a total footprint no greater than that of the CMOS 312, then the chip footprint of the entire parallel CMOS 312/CMIM 314/CVNCAP 316 element 310 may also be about, or less than, one-half that of a prior art single CMOS element 210.

In another aspect, independent of the vertical nature of the element 310, the amount of parasitic leakage current 307 of the parallel CMOS 312/CMIM 314/CVNCAP 316 element 310 may be about one-half that of the amount of the prior art single CMOS element 210 leakage current 306. Thus, although chip real estate concerns may indicate a preference for a vertical structure 310, other embodiments (not shown) may have a horizontal on-chip structure.

Figure 4:
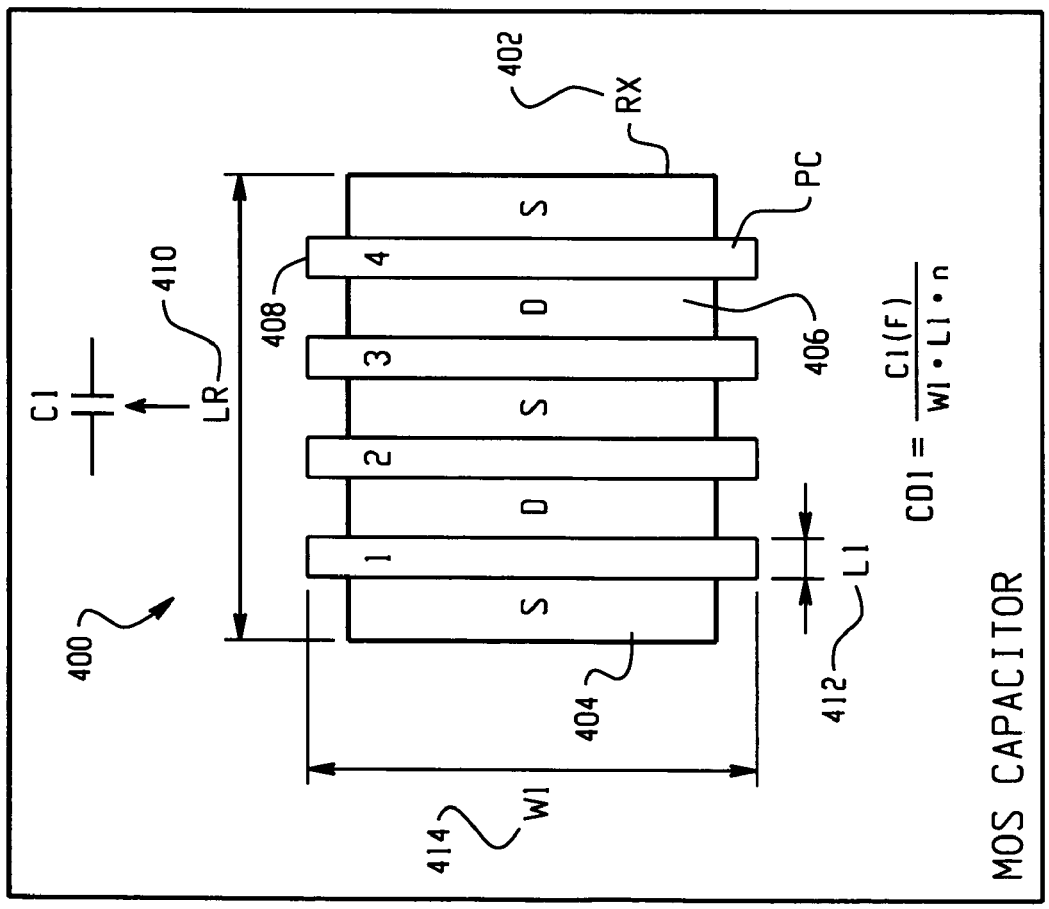
FIG. 4 is a top plan view of a MOS capacitor according to the present invention.

Referring now to FIG. 4, a top plan view of a CMOS 400 on a chip is illustrated. A bottom substrate (not shown) is covered with a silicon layer RX 402 upon which a plurality of source 404, gate 408 and drain regions 406 are disposed. The silicon layer RX 402 has an overall length dimension LR 410. Each of the polysilicon gate regions 408 has a common width L1 412 and a common length 414, wherein the length 414 also defines an effective width W1 of the CMOS 400. Accordingly, the CMOS 400 has an effective footprint area defined by W1*LR.

In one aspect, the capacitance density $CD_{MOS}$ of a single CMOS capacitor may be defined according to Equation 2:

$$CD_{MOS}=C_{MOS}/(W1*L1*n);\qquad\text{Equation 2}$$

wherein n is the number of gate regions 408.

In one example for 65 nanometer node circuitry, the capacitance density $C_{MOS}$ of prior art single MOS capacitor structure may be determined by Equation 2 as equal to 10 fF/um². However, the actual effective capacitance density $CD_{MOS\_REAL}$ may be defined as a function of the effective CMOS 400 footprint area defined by W1*LR by Equation 3:

$$CD_{MOS\_REAL}=C_{MOS}/(W1*LR)\qquad\text{Equation 3}$$

Accordingly, for 65 nanometer node circuitry where the capacitance density CDMOS of CMOS 400 is 10 fF/um², the actual effective capacitance density $CD_{MOS\_REAL}$ determined by Equation 3 is 4 fF/um².

Figure 5:
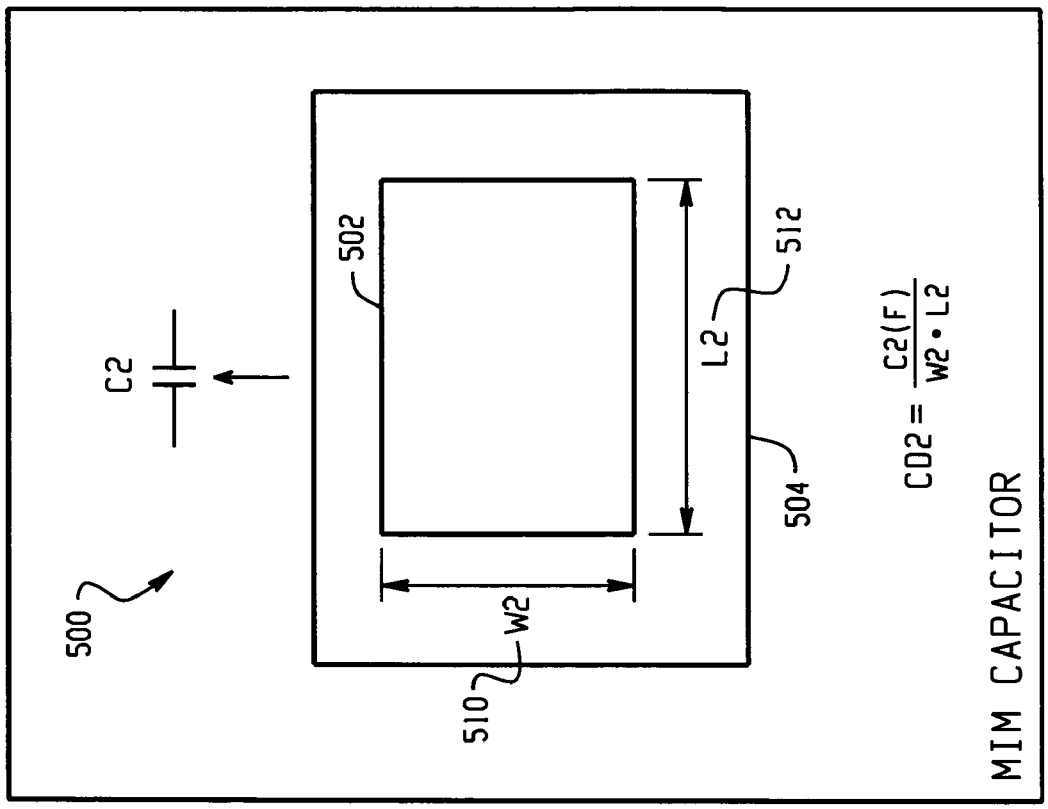
FIG. 5 is a top plan view of a MIM capacitor according to the present invention.

Referring now to FIG. 5, a plan view of a MIM capacitor structure 500 on a chip is illustrated. For a top plate 502 width W2 510 and length L2 512, wherein the top plate 502 has a smaller footprint area than the bottom plate 504, the capacitance density $CD_{MIM}$ may be defined as a function of the top plate 502 footprint according to Equation 4:

$$CD_{MIM}=C_{MIM}/(W2*L2)\qquad\text{Equation 4}$$

Accordingly, in one example for 65 nanometer node circuitry, the capacitance density $CD_{MIM}$ of the MIM capacitor structure 500 may be determined by Equation 4 as 2 fF/um².

Referring now to FIG. 6, a perspective view of a VNCAP capacitor structure 600 is illustrated. For overall capacitor width W3 602 and overall capacitor length L3 604, the capacitance density $CD_{VNCAP}$ may be defined according to Equation 5:

$$CD_{VNCAP} = C_{VNCAP}/(W3*L3) \qquad \text{Equation 5}$$

Accordingly, in one example for 65 nanometer node circuitry, the capacitance density $CD_{VNCAP}$ of the VNCAP capacitor structure 600 may be determined by Equation 5 as 2 fF/um².

Figure 7:
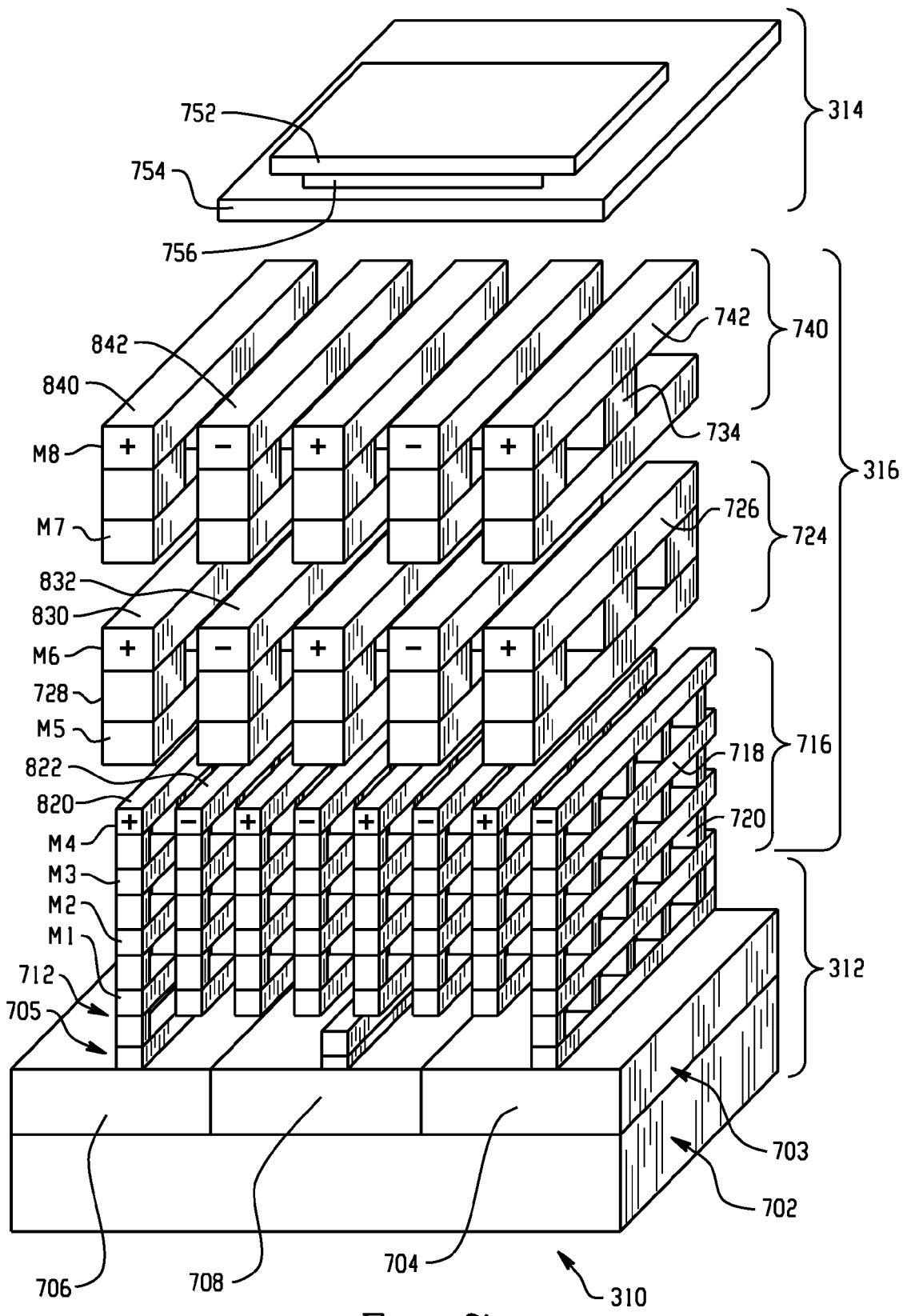
FIG. 7 is a perspective view of a capacitor structure according to the present invention.

Referring now to FIG. 7, a multilayer perspective illustration is provided of an embodiment of a parallel CMOS 312/CMIM 314/CVNCAP 316 element 310 discussed above. Although the present example is described with respect to specified numbers of metal layers within designated capacitor groupings, as well as overall metal layer totals, it is to be understood that the inventions described herein are not restricted to the specific embodiments: it will be readily apparent that more or less metal layers may be practiced within the teachings herein, and one skilled in the art may readily form alternative embodiments with different metal layer numbers and combinations. A CMOS 312 functions as a FEOL capacitor and comprises a first solid substrate 702 layer; a second silicon layer 703, the silicon layer comprising source 704, drain 706 and gate regions 708; and a third conductive polysilicon contact layer 705 comprising discrete contact regions disposed on each of the source 704, drain 706 and gate regions 708. A fourth layer of CA 712 provides a contact interface between the polysilicon contacts 705 and BEOL CMIM 314 and CVNCAP 316 capacitor structures.

The CVNCAP 316 is defined by three groups of progressively larger metal layers. A first bottom group 716 of four metal layers 718 (M1 through M4, respectively the 1st, $2^{nd}$, $3^{rd}$ and $4^{th}$ metal layers from the bottom of the multicapacitor element 310) are each separated by an insulator (or dielectric) material layer 720, the first metal layer M1 in circuit connection with the CA layer 712. A second middle group of larger metal layers 726 (M5 and M6, respectively the $5^{th}$ and $6^{th}$ metal layers) are mounted on the first group of layers 716 and separated by a dielectric material layer 728 from each other. Lastly, a third largest top group 740 of metal layers 742 (M7 and M8, respectively the $7^{th}$ and $8^{th}$ metal layers) are mounted atop the second metal layer group 724 and separated by a dielectric material layer 734 from each other.

In another aspect each of the three CVNCAP metal levels 718, 726 and 742 further comprise parallel "−" signed and "+" signed metal plates. More particularly, the CVNCAP first level metal layers M1 through M4 718 further each comprise a plurality of "+" signed metal plates 820 in an alternative horizontal parallel relationship with a plurality of "−" signed metal plates 822. CVNCAP second middle level metal layers M5 and M6 further each comprise a plurality of "+" signed metal plates 830 in an alternative horizontal parallel relationship with a plurality of "−" signed metal plates 832. And CVNCAP third top level metal layers M7 and M8 742 further each comprise a plurality of "+" signed metal plates 840 in an alternative horizontal parallel relationship with a plurality of "−" signed metal plates 842.

The MIMCAP 314 is also a part of the BEOL and has a top plate 752 and a bottom plate 754 and a dielectric 756 therebetween, with the MIMCAP 314 interfaced to the CVNCAP top metal layers 732, as will be described presently.

Figures 8A, 8B:
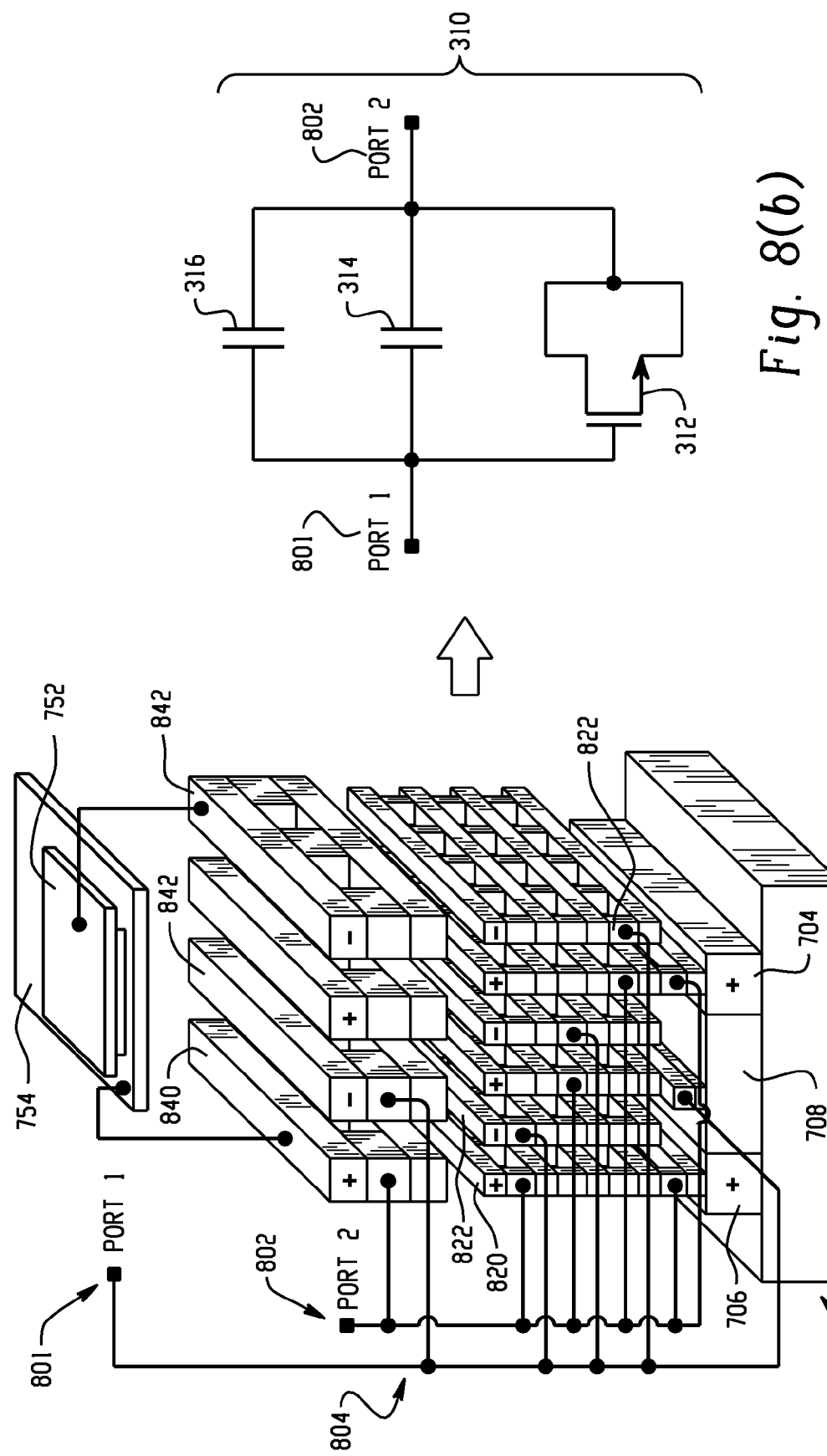
FIG. 8(a) is a perspective illustration of the capacitor structure of FIG. 7.
FIG. 8(b) is an electrical schematic illustration of the capacitor structure of FIG. 8(a).
Figure 8C:
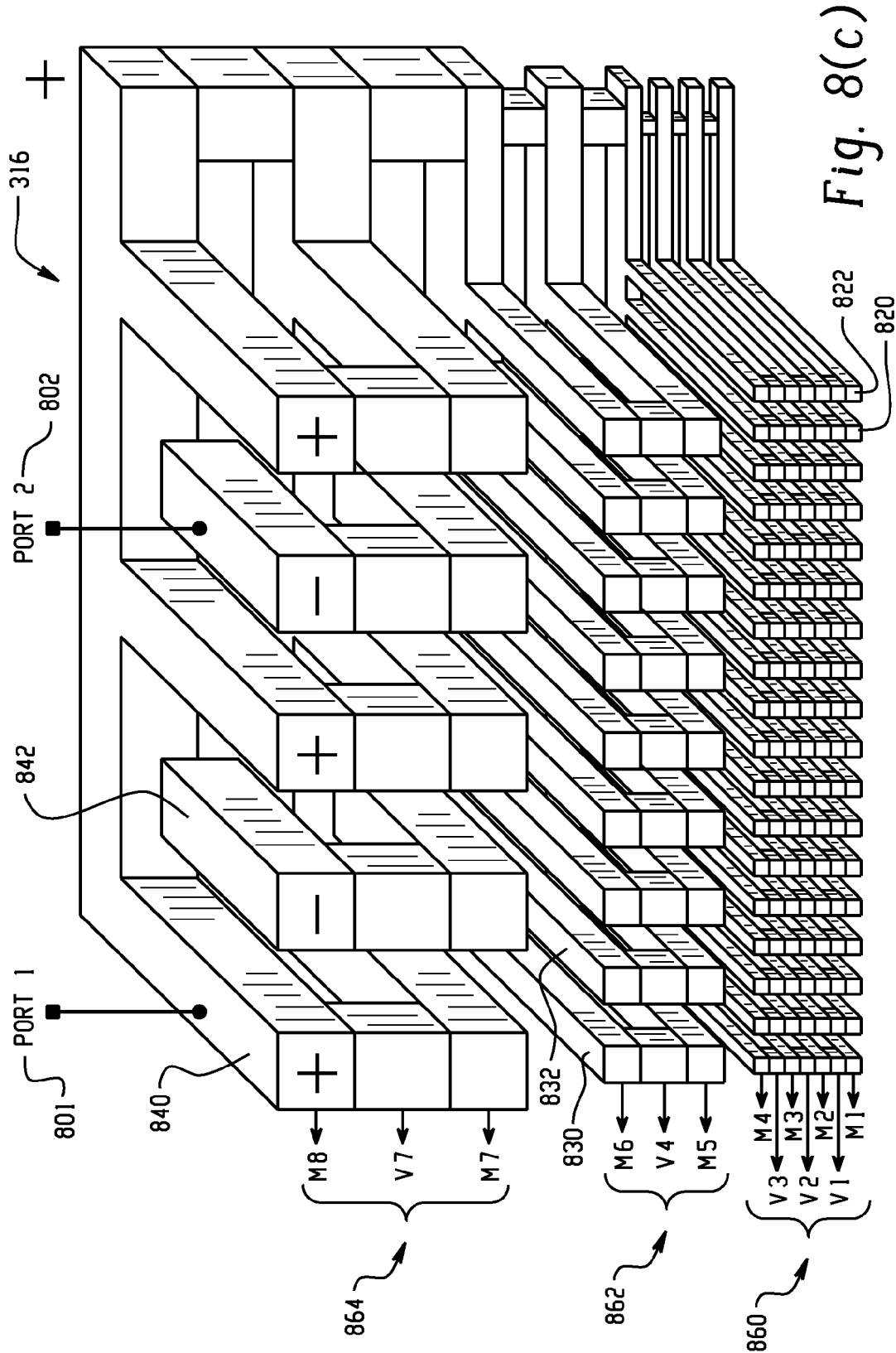
FIG. 8(c) is perspective view of a VNCAP element according to the present invention.

FIG. 8(a) shows a representation of the multicapacitor chip element 310 as described in FIG. 7 including the electrical connection 804 of circuit ports Port 1 801 and Port 2 802 (for clarity the CVNCAP middle metal layers 726 and dielectric layer 728 are omitted). A simplified electrical schematic of the element 310 of FIG. 8(a) is shown in FIG. 8(b). FIG. 8(c) is another perspective view of the CVNCAP 316 of element 310 and further illustrating the parallel metal plate and composite capacitance structure, and FIG. 8(d) is a schematic electrical illustration of the composite capacitor characteristic of the CVNCAP 316.

In accordance with established practices, capacitor(s) in the BEOL of the chip assembly are connected with the design capacitance and the negative parasitic capacitances connected in series with one another and in parallel with the positive parasitic capacitance. Accordingly, Port 1 801 is connected electrically to the MOSCAP 312 gates 708, the "−" signed CVNCAP first metal level plates 822, the "−" signed VNCAP second metal level plates 832, the "−" signed third top metal level plates 842 and to the CMIM top plate 752. Port 2 802 is connected electrically to the "+" signed CVNCAP first metal level plates 820, the "+" signed CVNCAP second metal level plates 830, the "+" signed third top metal level plates 840 and to the CMIM bottom plate 754, sources 704 and drains 706.

Figure 8D:
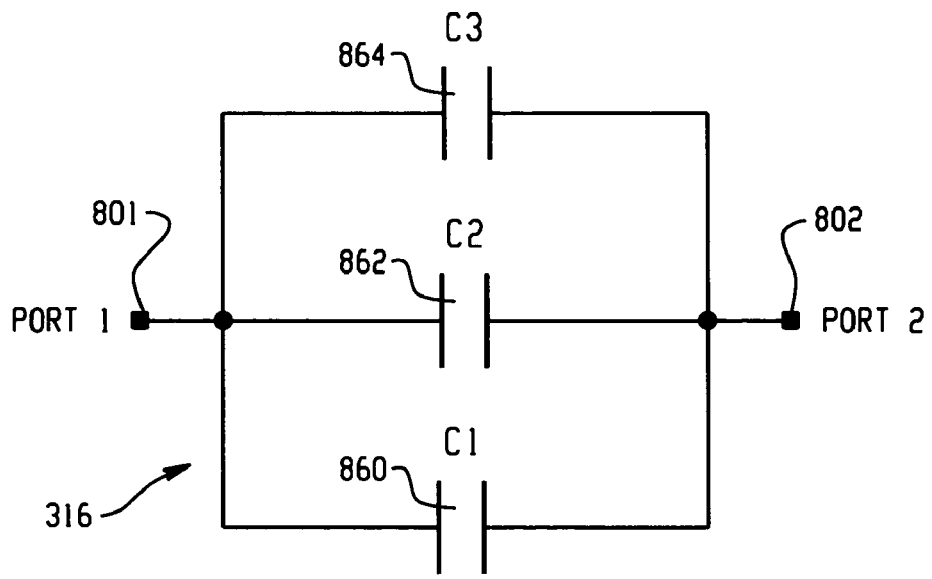
FIG. 8(d) is an electrical schematic illustration of the VNCAP of FIG. 8(c).

As illustrated in FIGS. 8(c) and 8(d), in one aspect the three divergently sized CVNCAP 316 bottom 716, middle 724 and top 740 metal layers each define a capacitor region. More particularly, the CVNCAP 316 bottom metal levels M1 through M4 together define a capacitor region 860; the CVNCAP 316 middle levels M5 and M6 together define a capacitor region 862; and the CVNCAP 316 top metal levels M7 and M8 together define a capacitor region 864. The CVNCAP element 316 capacitance value, and parasitic capacitance nature, is thus that of parallel capacitor elements 860, 862 and 864.

In one aspect, two passive capacitors (CMIM 314 and CVNCAP 316) and an active capacitor (CMOS 312) in a parallel circuit arrangement thus function as one on-chip capacitor between Port 1 801 and Port 2 802, and thus in a circuit incorporating CMOS 312/CMIM 314/CVNCAP 316 element 310.

In another aspect, the CMOS 312/CMIM 314/CVNCAP 316 element 310 comprises a vertical connection between a BEOL capacitor (CMIM 314/CVNCAP 316) and an FEOL capacitor (CMOS 312), providing space saving advantages over other prior art structures, increasing capacitance density on an IC by a factor of 2 over a single CMOS on-chip capacitor, and thus providing improved manufacturing cost efficiencies.

In another aspect, by using a CVNCAP 316 to connect between a MIM capacitor 314 and a MOS capacitor 312, performance is increased over other prior art structures. In one aspect, a new parasitic boost structure is accomplished through asymmetrical capacitor geometry according to the present invention.

Figure 9:
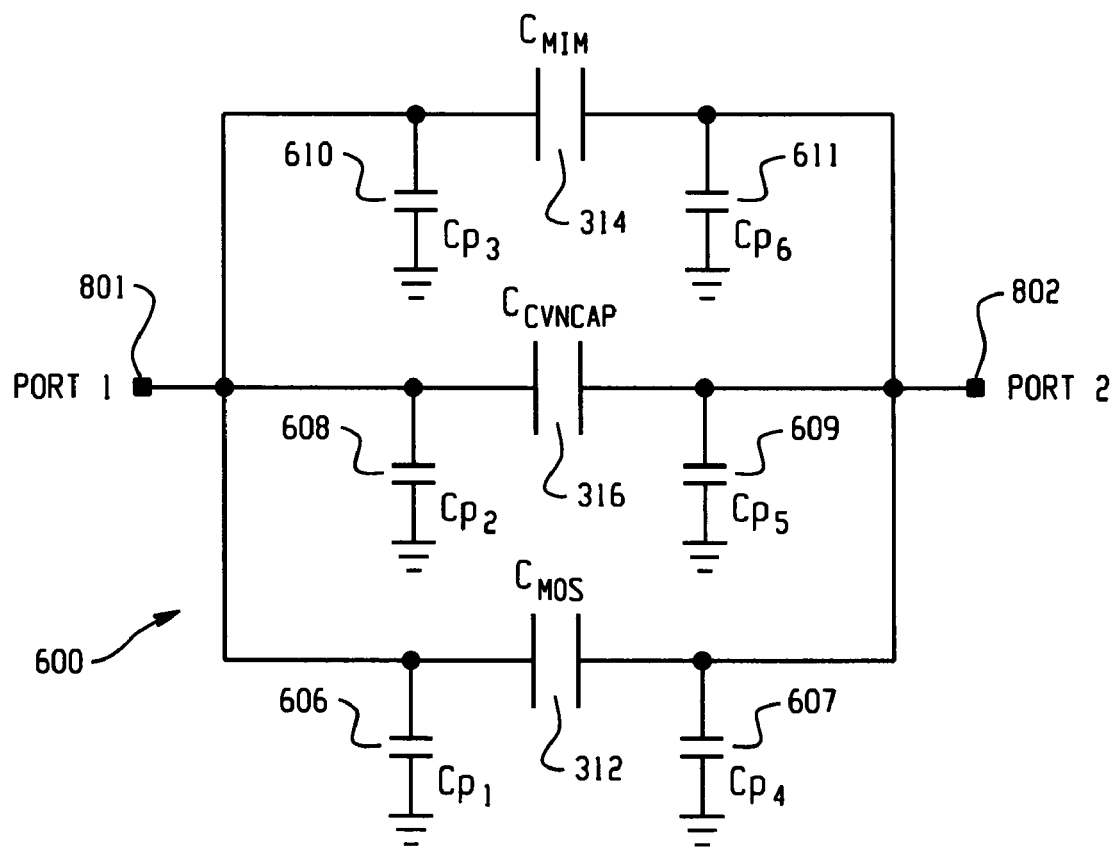
FIG. 9 is an electrical schematic illustration of a capacitor structure according to the present invention.

As is well known in the design of on-chip capacitor structures, each on-chip capacitor inherently comprises two components: a main capacitor structure and at least one parasitic capacitor structure formed through proximity to at least one other capacitor or other electrically similar element. More particularly, FIG. 9 provides an electrical schematic diagram illustrating the parasitic capacitance properties of CMOS 312/CMIM 314/CVNCAP 316 element 310. Parasitic capacitors $Cp_1$ through $Cp_6$ (606 to 610) are effectively generated in each of Port 1 801 and Port 2 802 and, thus, there are two parasitic capacitors Cp for each main capacitor, wherein:

$Cp_1$ 606 and $Cp_4$ 607 are the parasitic capacitors for the CMOS capacitor 312;

$Cp_2$ 608 and $Cp_5$ 609 are the parasitic capacitors for CVN-CAP capacitor 316.

$Cp_3$ 610 and $Cp_6$ 611 are the parasitic capacitors for MIM-CAP capacitor 314.

However, due to the asymmetrical, parallel and vertical structure of CMOS 312/CMIM 314/CVNCAP 316 element 310 as described above and illustrated in the figures filed herewith, inherent parasitic capacitance is reduced. More particularly, total element 310 capacitance $C_{TOTAL}$ and total element 310 parasitic capacitance $C_{PAR}$ may be derived as follows from Equation Set 6:

$$C_{TOTAL}=C_{MOS}//C_{VNCAP}//V_{MIM}//V_{PAR}$$

$$C_{TOTAL}=C_{MOS}+C_{VNCAP}+V_{MIM}+V_{PAR}$$

$$C_{PAR}=Cp_1+Cp_2+Cp_3 \quad \text{Equation Set 6}$$

Thus, design leakage current reduction to one-half of the expected parasitic capacitance is achieved, thereby providing savings in chip power consumption, such as, for example, during the chipboard circuit's idle mode.

While specific embodiments of the present invention have been described herein, it is to be understood that variations may be made without departing from the scope thereof, and such variations may be apparent to those skilled in the art represented herein, as well as to those skilled in other arts. The materials identified above are by no means the only materials suitable for the manufacture of the MOS, VNCAP and MIMCAP capacitor structures, and substitute materials will be readily apparent to one skilled in the art.

What is claimed is:

1. A method for providing a composite capacitive circuit assembly, comprising:
   forming a metal-oxide-silicon capacitor at a bottom of a front end-of-line of a semiconductor chip by disposing a plurality of source, gate and drain regions within an overall horizontal length dimension of the metal-oxide-silicon capacitor;
   the plurality of metal-oxide-silicon capacitor gate regions each having a common horizontal length, the common horizontal lengths of the plurality of gate regions defining an effective horizontal width dimension of the metal-oxide-silicon capacitor;
   the effective horizontal width dimension and the overall horizontal length dimension defining an effective horizontal footprint area of the metal-oxide-silicon capacitor on the semiconductor chip;
   forming a vertical-native capacitor with a plurality horizontal metal layers in a back end-of-line of the semiconductor chip and vertically above the metal-oxide-silicon capacitor within the metal-oxide-silicon capacitor horizontal footprint area, each of the vertical-native capacitor horizontal metal layers comprising a plurality of parallel positive plates alternating with a plurality of parallel negative plates;
   forming a metal-insulator-metal capacitor in the back end-of-line of the semiconductor chip and vertically above the metal-oxide-silicon capacitor and the vertical-native capacitor and within the metal-oxide-silicon capacitor horizontal footprint area, the metal-insulator-metal capacitor having a top negative plate horizontally spaced over a parallel bottom positive plate;
   electrically connecting each of the vertical-native capacitor parallel positive plates, the metal-insulator-metal capacitor bottom positive plate, and the plurality of metal-oxide-silicon capacitor drains and sources with a first port;
   electrically connecting each of the vertical-native capacitor parallel negative plates, the metal-insulator-metal capacitor top negative plate and the plurality of metal-oxide-silicon capacitor gates with a second port; and
   the metal-insulator-metal capacitor, the vertical-native capacitor and the metal-oxide-silicon capacitor defining a composite capacitance density value between the first port and the second port, the composite capacitance density value about twice a capacitance density value of the metal-oxide-silicon capacitor.

2. The method of claim 1, wherein the metal-oxide-silicon capacitor has a capacitance density of about 4 fF/um$^2$;
   the vertical-native capacitor has a capacitance density of about 2 fF/um$^2$;
   the metal-insulator-metal capacitor has a capacitance density of about 2 fF/um$^2$.

3. The method of claim 1, the forming of the vertical-native capacitor plurality of horizontal metal layers comprising:
   forming a first plurality of the vertical-native capacitor horizontal metal layers above the metal-oxide-silicon capacitor, each of the first plurality of vertical-native capacitor horizontal metal layers having a first metal layer vertical thickness; and
   forming a second plurality of the vertical-native capacitor horizontal metal layers above the first plurality of vertical-native capacitor horizontal metal layers, each of the second plurality of vertical-native capacitor horizontal metal layers having a second metal layer vertical thickness different from the first metal layer vertical thickness.

4. The method of claim 3, comprising:
   the vertical-native capacitor first plurality of metal layers providing a first vertical-native capacitor capacitance value between the first port and the second port;
   the vertical-native capacitor second plurality of metal layers providing a second vertical-native capacitor capacitance value between the first port and the second port and different from the first vertical-native capacitor capacitance value; and
   the vertical-native capacitor providing a total capacitance between the first port and the second port equal to a product of the first vertical-native capacitor capacitance value and the second vertical-native capacitor capacitance value.

5. The method of claim 1, further comprising:
   the electrically connecting the metal-insulator-metal capacitor positive plate to the first port generating a first port/metal-insulator-metal capacitor parasitic capacitance;
   the electrically connecting the metal-insulator-metal capacitor negative plate to the second port generating a second port/metal-insulator-metal capacitor parasitic capacitance;
   the electrically connecting the plurality of vertical-native capacitor positive plates to the first port generating a first port/vertical-native capacitor parasitic capacitance;
   the electrically connecting the plurality of vertical-native capacitor negative plates to the second port generating a second port/vertical-native capacitor parasitic capacitance;
   the electrically connecting the plurality of metal-oxide-silicon capacitor sources and drains to the first port generating a first port/metal-oxide-silicon capacitor parasitic capacitance;

the electrically connecting the plurality of metal-oxide-silicon capacitor gates to the second port generating a second port/metal-oxide-silicon capacitor parasitic capacitance; and generating a total inherent parasitic capacitance between the first port and the second port for the composite capacitive circuit assembly equal to a total of the first port/metal-insulator-metal capacitor parasitic capacitance, the first port/vertical-native capacitor parasitic capacitance and the first port/metal-oxide-silicon capacitor parasitic capacitance.

* * * * *